(12) United States Patent
Niikura

(10) Patent No.: US 12,155,377 B2
(45) Date of Patent: Nov. 26, 2024

(54) GATE DRIVE CIRCUIT OF SWITCHING CIRCUIT INCLUDING N-CHANNEL TYPE TRANSISTOR

(71) Applicant: ROHM CO., LTD., Kyoto (JP)

(72) Inventor: Hiroki Niikura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 201 days.

(21) Appl. No.: 17/836,114

(22) Filed: Jun. 9, 2022

(65) Prior Publication Data

US 2022/0321116 A1 Oct. 6, 2022

Related U.S. Application Data

(63) Continuation of application No. PCT/JP2020/046076, filed on Dec. 10, 2020.

(30) Foreign Application Priority Data

Dec. 12, 2019 (JP) ................................. 2019-224735

(51) Int. Cl.
  *H02M 1/08* (2006.01)
  *H02M 1/00* (2006.01)
  (Continued)

(52) U.S. Cl.
  CPC ...... *H03K 17/0822* (2013.01); *H02M 1/0006* (2021.05); *H02M 1/08* (2013.01);
  (Continued)

(58) Field of Classification Search
  CPC ........ H02M 1/08; H02M 1/32; H02M 1/0006; H02M 3/158; H03K 17/0822;
  (Continued)

(56) References Cited

U.S. PATENT DOCUMENTS

2006/0017466 A1* 1/2006 Bryson ............... H03K 17/063
  326/88
2011/0133711 A1* 6/2011 Murakami ............ H02M 1/32
  323/282

(Continued)

FOREIGN PATENT DOCUMENTS

CN 108494234 A * 9/2018 ............ H02M 1/088
WO WO-2019193805 A1 * 10/2019 .............. H02M 1/08

OTHER PUBLICATIONS

International Search Report for International Application No. PCT/JP2020/046076; with PCT Written Opinion of the International Searching Authority; Date of Mailings, Feb. 2, 2021.

*Primary Examiner* — Kyle J Moody
*Assistant Examiner* — Jye-June Lee
(74) *Attorney, Agent, or Firm* — CANTOR COLBURN LLP

(57) ABSTRACT

A switching circuit includes a high-side transistor and a low-side transistor, each of which is of an N-channel type. A switch and a rectifying element of a PMOS transistor are provided in series between a constant voltage line through which a constant voltage is supplied and a bootstrap line. A comparison circuit operates using a high-side power supply voltage, which is a potential difference between the bootstrap line and a switching line, as a power supply to generate a detection signal indicating a magnitude relationship between the high-side power supply voltage and a threshold voltage. A level shift circuit level-shifts the detection signal down to a signal of which a ground voltage is low. A PMOS driver drives the switch asynchronously with switching of the low-side transistor in response to an output of the level shift circuit.

4 Claims, 10 Drawing Sheets

(51) Int. Cl.
*H02M 1/32* (2007.01)
*H02M 3/158* (2006.01)
*H03K 3/356* (2006.01)
*H03K 17/082* (2006.01)
*H03K 19/0185* (2006.01)

(52) U.S. Cl.
CPC ............ *H02M 1/32* (2013.01); *H02M 3/158* (2013.01); *H03K 3/356113* (2013.01); *H03K 19/018528* (2013.01); *H03K 2217/0063* (2013.01); *H03K 2217/0072* (2013.01)

(58) Field of Classification Search
CPC ..... H03K 3/356113; H03K 19/018528; H03K 19/018521; H03K 2217/0063; H03K 2217/0072; H03K 2217/0081; H02J 1/02
See application file for complete search history.

(56) References Cited

U.S. PATENT DOCUMENTS

| | | | |
|---|---|---|---|
| 2013/0241621 A1* | 9/2013 | Forghani-Zadeh | H03K 17/08122 327/315 |
| 2017/0117803 A1* | 4/2017 | Matsuki | H02M 1/08 |
| 2020/0052687 A1* | 2/2020 | Ming | H03K 17/063 |

* cited by examiner

<Prior Art>

GATE DRIVE CIRCUIT OF SWITCHING CIRCUIT INCLUDING N-CHANNEL TYPE TRANSISTOR

CROSS REFERENCE TO RELATED APPLICATIONS

This application is a continuation under 35 U.S.C. § 120 of PCT/JP2020/046076, Dec. 10, 2020, which is incorporated herein by reference, and which claimed priority to Country Application No. 2019-224735, filed Dec. 12, 2019. The present application likewise claims priority under 35 U.S.C. § 119 to Japanese Application No. 2019-224735, filed Dec. 12, 2019, the entire content of which is also incorporated herein by reference.

BACKGROUND

1. Technical Field

The present disclosure relates to a switching circuit.

2. Description of the Related Art

Switching circuits such as half-bridge circuits and full-bridge circuits are used in the field of power electronics including DC/DC converters, AC/DC converters, and inverters.

FIG. 1 is a circuit diagram of a switching circuit 100R. The switching circuit 100R includes a high-side transistor MH and a low-side transistor ML coupled in series, and a gate drive circuit 200R that drives the high-side transistor MH and the low-side transistor ML. The gate drive circuit 200R switches a switching terminal SW between two states of a high state (input voltage $V_{IN}$) and a low state (ground voltage 0V) or three states further including a high impedance state in addition to the two states by controlling on and off of the high-side transistor MH and the low-side transistor ML.

The gate drive circuit 200R includes a high-side driver 202, a low-side driver 204, and a rectifying element D1. The high-side transistor MH is an N-channel transistor, and in order to turn on the high-side transistor MH, a drive voltage higher than the input voltage $V_{IN}$ is required. A bootstrap circuit is used to generate a drive voltage higher than the input voltage $V_{IN}$. The rectifying element D1 and an external bootstrap capacitor $C_B$ make up the bootstrap circuit. The bootstrap capacitor $C_B$ has one end coupled to the switching terminal SW of the switching circuit 100, and a constant voltage $V_{REG}$ is applied to another end of the bootstrap capacitor $C_B$ through the rectifying element D1.

When the switching terminal SW is low (i.e., 0 V), the bootstrap capacitor $C_B$ is charged at the constant voltage $V_{REG}$. When the low-side driver 204 output a low level, and the high-side driver 202 outputs a high level, a bootstrap voltage $V_B$ is applied to a gate of the high-side transistor MH. When a voltage $V_S$ applied to the switching terminal SW, that is, a source voltage applied to the high-side transistor MH increases, the bootstrap voltage $V_B$ increases accordingly, so that a drive voltage higher than a threshold value can be applied across the gate and the source of the high-side transistor MH.

As such a switching element, a silicon (Si) MOSFET or a bipolar transistor is typically used, but a high electron mobility transistor (HEMT) using gallium nitride (GaN) has attracted attention as an alternative recently. The GaN-HEMT has excellent high frequency characteristics, low dynamic resistance, and high withstand voltage, and it is expected to make DC/DC converters higher in efficiency and smaller in size by replacing the Si devices with the GaN-HEMTs.

In FIG. 1, when the GaN-HEMT is used as the high-side transistor MH and the low-side transistor ML, an overvoltage may be applied to the bootstrap capacitor $C_B$. The reason will be described below.

When the high-side transistor MH and the low-side transistor ML are simultaneously turned on, a through electric current flows. Therefore, in order to prevent the through current from flowing, a dead time during which both the high-side transistor MH and the low-side transistor ML are turned off is inserted. In some applications including DC/DC converters, during a dead time in which the switching circuit 100 transitions from low output to high output, a reverse electric current flows through the low-side transistor ML. For the Si-MOSFETs, the voltage $V_S$ applied to the switching terminal SW is clamped to −Vf by a body diode of the low-side transistor ML. Therefore, when a voltage drop across the rectifying element D1 is ignored, the voltage applied across the bootstrap capacitor $C_B$ is clamped to $V_{REG}$+Vf.

On the other hand, the GaN-HEMT has no body diode, and when the reverse current flows through the low-side transistor ML, a drain-source voltage VDs becomes as high as several volts. Therefore, a voltage $V_{REG}+V_{DS}$ is applied across the bootstrap capacitor $C_B$ to bring the bootstrap capacitor $C_B$ into an overcharged state.

When the high-side driver 202 outputs a high level with the bootstrap capacitor $C_B$ overcharged, an overvoltage is applied across the gate and the source of the high-side transistor MH, which makes the element reliability lower.

In order to solve this problem, it is necessary to clamp the voltage $V_{BS}$ across the bootstrap capacitor $C_B$. For example, US 2013/0241621 A1 discloses a related art. FIG. 2 is a circuit diagram of a drive circuit 200S in the related art. Specifically, in the drive circuit 200S disclosed in US 2013/0241621 A1, a switch (PMOS transistor) SW1 is inserted in series with a rectifying element (diode) D1 for bootstrap.

Resistors R11, R12 divide a voltage $V_B$ applied to a bootstrap terminal relative to the ground voltage. The resistors R21, R22 divide a constant voltage $V_{REG}$ with a voltage $V_S$ applied to a switching terminal. Voltages V1, V2 obtained by the division are input to a comparator 208 through switches SW11, SW12. The switches SW11, SW12 are controlled to be turned on while a low-side transistor ML is on. While the low-side transistor ML is on, $V_S \approx 0$ V, so that the voltage $V_B$ applied to the bootstrap terminal, that is, a voltage $V_{BS}$ across a bootstrap capacitor $C_B$, can be compared with a threshold value based on the constant voltage $V_{REG}$. The output of the comparator 208 is input to a gate of a PMOS transistor SW1.

In the technique described in US 2013/0241621 A1, the voltage comparison is performed by the comparator 208 only while the low-side transistor ML is on, and while the low-side transistor ML is off, the switches SW11, SW12 are off, the voltage input to the comparator 208 is held, and the comparison result is also maintained. While the switches SW11, SW12 are off, the input of the comparator 208 is in a high-impedance state, making the comparator 208 susceptible to noise. Therefore, when noise enters the input terminal of the comparator 208 while the low-side transistor ML is off, the comparator 208 makes erroneous detection.

SUMMARY

The present disclosure has been made in view of the above-described problems.

One embodiment of the present disclosure relates to a gate drive circuit of a switching circuit including a high-side transistor and a low-side transistor, each of which is of an N-channel type. The gate drive circuit includes a switching terminal to be coupled to (or coupled to) a source of the high-side transistor, a drain of the low-side transistor, and one end of a bootstrap capacitor, a bootstrap terminal to be coupled to (or coupled to) another end of the bootstrap capacitor, a switching line coupled to the switching terminal, a bootstrap line coupled to the bootstrap terminal, a high-side driver having an output coupled to a gate of the high-side transistor, having an upper power supply node coupled to the bootstrap line, and having a lower power supply node coupled to the switching line, a low-side driver having an output coupled to a gate of the low-side transistor, a switch and a rectifying element of a P-channel metal oxide semiconductor (PMOS) transistor provided in series between a constant voltage line through which a constant voltage is supplied and the bootstrap line, a comparison circuit structured to operate using a high-side power supply voltage as a power supply, the high-side power supply voltage being a potential difference between the bootstrap line and the switching line, to generate a detection signal indicating a magnitude relationship between the high-side power supply voltage and a threshold voltage, a level shift circuit structured to level-shift the detection signal down to a signal of which a ground voltage is low, and a PMOS driver structured to drive the switch asynchronously with switching of the high-side transistor in response to an output of the level shift circuit.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Outline of Embodiment

Figure 1:
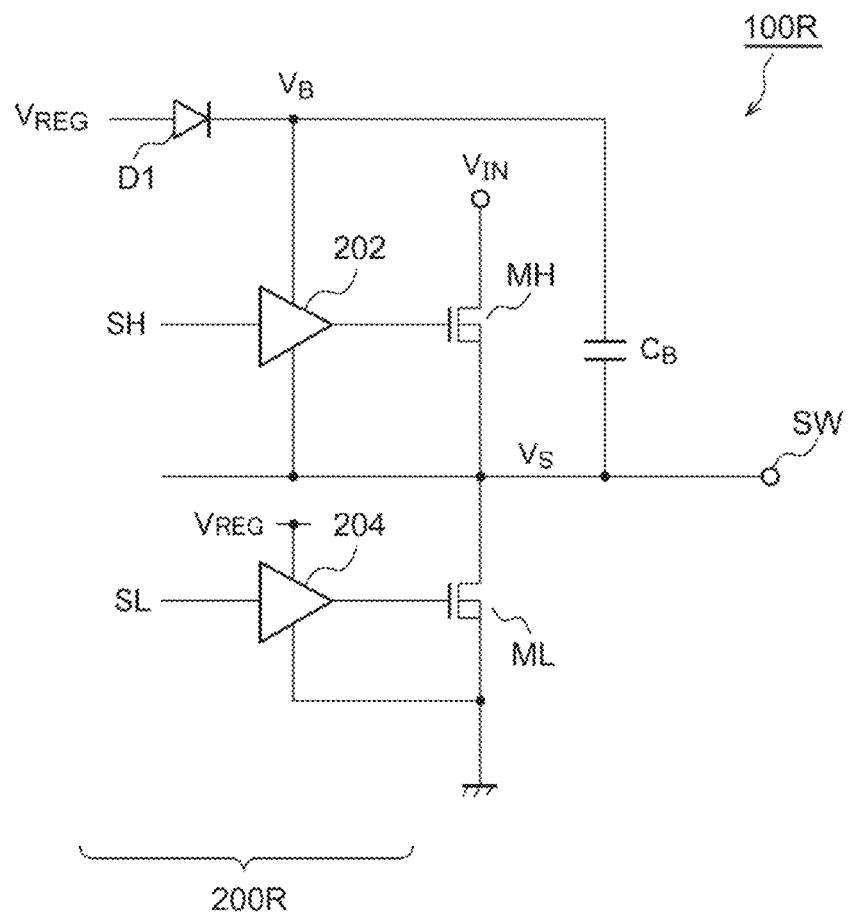
FIG. 1 is a circuit diagram of a switching circuit.
Figure 2:
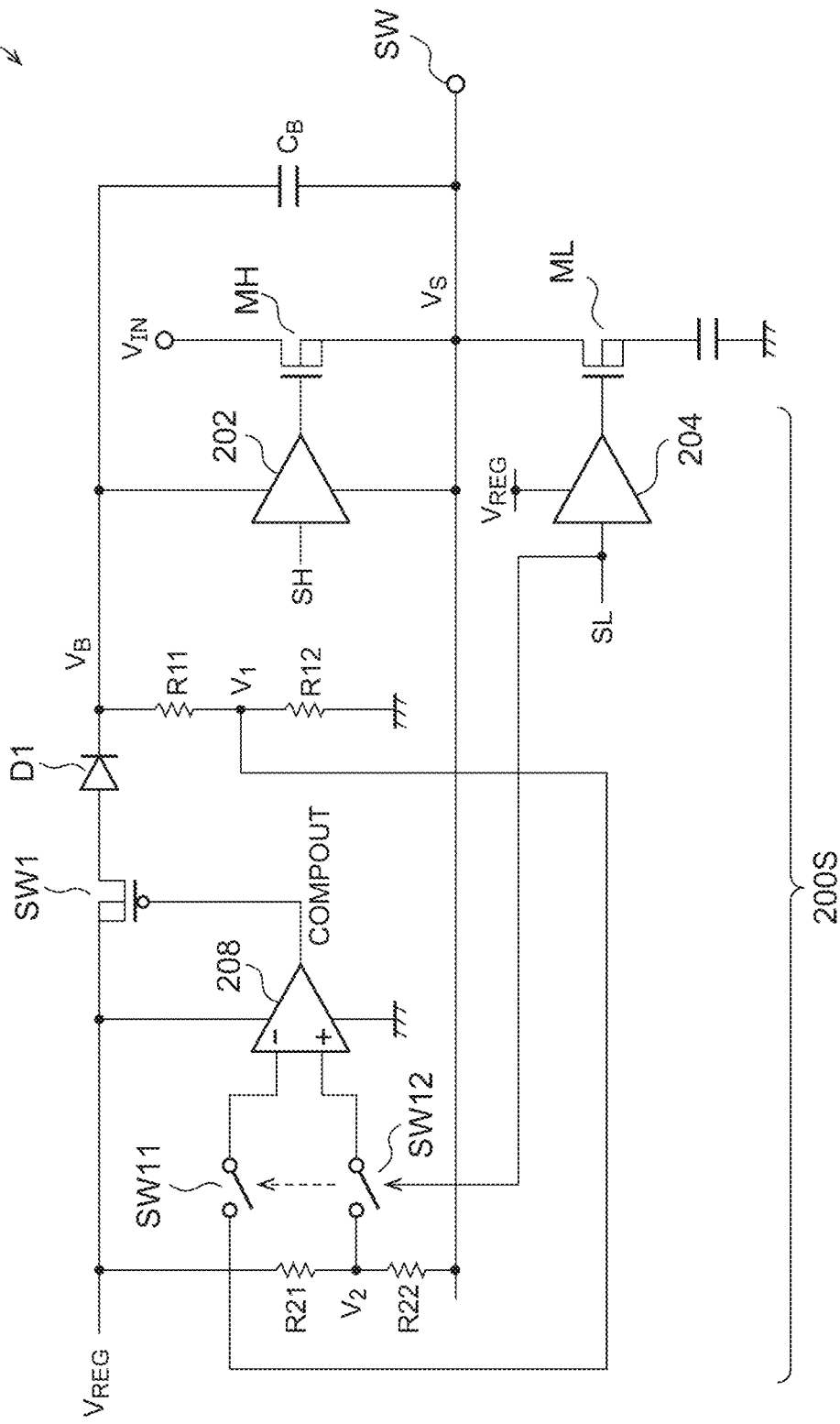
FIG. 2 is a circuit diagram of a drive circuit in the related art.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended neither to identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

One embodiment relates to a gate drive circuit of a switching circuit including an N-channel high-side transistor and an N-channel low-side transistor. The gate drive circuit includes a switching terminal to be coupled to (or coupled to) a source of the high-side transistor, a drain of the low-side transistor, and one end of a bootstrap capacitor, a bootstrap terminal to be coupled to (or coupled to) another end of the bootstrap capacitor, a switching line coupled to the switching terminal, a bootstrap line coupled to the bootstrap terminal, a high-side driver having an output coupled to a gate of the high-side transistor, having an upper power supply node coupled to the bootstrap line, and having a lower power supply node coupled to the switching line, a low-side driver having an output coupled to a gate of the low-side transistor, a switch and a rectifying element of a P-channel metal oxide semiconductor (PMOS) transistor provided in series between a constant voltage line through which a constant voltage is supplied and the bootstrap line, a comparison circuit structured to operate using a high-side power supply voltage as a power supply, the high-side power supply voltage being a potential difference between the bootstrap line and the switching line, to generate a detection signal indicating a magnitude relationship between the high-side power supply voltage and a threshold voltage, a level shift circuit structured to level-shift the detection signal down to a signal of which a ground voltage is low, and a PMOS driver structured to drive the switch asynchronously with switching of the high-side transistor in response to an output of the level shift circuit.

This configuration allows, regardless of whether the low-side transistor is on or off, the high-side power supply voltage generated across the bootstrap capacitor to be constantly monitored by the comparison circuit. Therefore, there is no period during which the input of the comparison circuit is in a high-impedance state, and it is thus possible to make noise immunity higher.

According to one embodiment, the level shift circuit may include a pulse generator structured to generate a set pulse and a reset pulse having a predetermined pulse width in response to a positive edge and a negative edge of the detection signal, respectively, an open drain circuit including a first transistor having a source coupled to the bootstrap line and structured to turn on in response to the set pulse, and a second transistor having a source coupled to the bootstrap line and structured to turn on in response to the reset pulse, and a latch circuit including a first transistor and a second transistor that are cross-coupled, the latch circuit being structured to make a state transition in response to an output of the open drain circuit, and the level shift circuit may output a signal corresponding to a state of the latch circuit.

This configuration allows the high-side detection signal to be transmitted to the low side with a low delay.

According to one embodiment, the level shift circuit may further include a latch stabilization circuit provided between a power supply line and a ground line and structured to fix, at a low level, one of complementary first node and second node of the latch circuit in accordance with the output of the level shift circuit. The action on the first node and the second node made by the latch stabilization circuit in accordance with the output of the level shift circuit makes it possible to fix the state of the latch circuit. The latch stabilization circuit need not make a state transition of the latch circuit, so that it is possible to make operation electric current extremely small. In addition, the latch stabilization circuit is provided between the high-side line and the switching line, and the potential difference between the high-side line and the switching line is about 5 V or 12 V, so that it is possible to greatly reduce power consumption as compared with a case where, in order to fix the state of the latch circuit, the current is caused to flow between the high-side line and the ground line between which the potential difference is several hundred volts.

Embodiment

An embodiment will be described below with reference to the drawings. The same or equivalent components, members, and processes shown in the drawings are denoted by the same reference numerals, and redundant description will be omitted as needed. Further, the embodiment is not intended to limit the invention but is given as an example, and all features described in the embodiment and combinations of the features are not necessarily essential to the invention.

Herein, "a state where a member A is connected to a member B" includes not only a case where the member A and the member B are physically and directly connected to each other, but also a case where the member A and the member B are indirectly connected to each other via another member that has substantially no effect on an electrical connection state between the member A and the member B or that does not impair a function or an effect exhibited by the connection between the member A and the member B.

Similarly, "a state where a member C is provided between the member A and the member B" includes not only a case where the member A and the member C, or the member B and the member C are directly connected to each other, but also a case where the members are indirectly connected to each other via another member that has substantially no effect on an electrical connection state among the members or that does not impair a function or an effect exhibited by the connection among the members.

Figure 3:
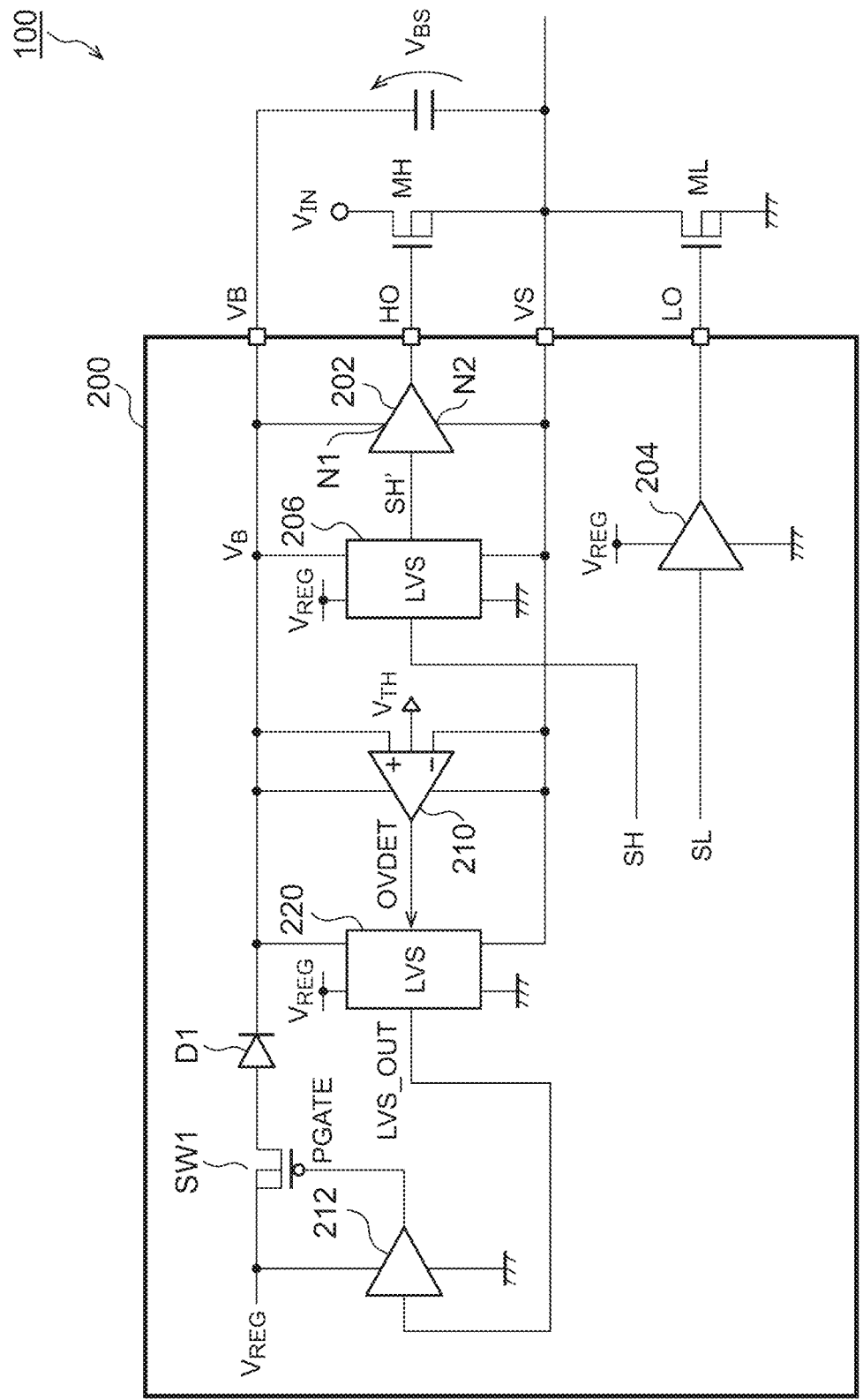
FIG. 3 is a block diagram of a switching circuit including a gate drive circuit according to an embodiment.

FIG. 3 is a block diagram of a switching circuit 100 including a gate drive circuit 200 according to the embodiment. The switching circuit 100 includes a high-side transistor MH, a low-side transistor ML, a bootstrap capacitor $C_B$, and the gate drive circuit 200. The high-side transistor MH and the low-side transistor ML are GaN-HEMTs (GaN-FETs).

The gate drive circuit 200 controls the high-side transistor MH and the low-side transistor ML. The gate drive circuit 200 turns on the high-side transistor MH when a high-side pulse SH is high and turns off the high-side transistor MH when the high-side pulse SH is low. The gate drive circuit 200 turns on the low-side transistor ML when a control signal SL is high and turns off the low-side transistor ML when the control signal SL is low.

The gate drive circuit 200 includes a high-side driver 202, a low-side driver 204, a level shifter 206, a diode (rectifying element) D1, a switch SW1, a comparison circuit 210, a level shift circuit 220D, and a PMOS driver 212, and all the elements are integrated onto one semiconductor substrate.

An output pin HO of the gate drive circuit 200 is coupled to a gate of the high-side transistor MH, and a switching pin (terminal) VS is coupled to a source of the high-side transistor MH and a drain of the low-side transistor ML. An output pin LO of the gate drive circuit 200 is coupled to a gate of the low-side transistor ML.

The low-side driver 204 drives the low-side transistor ML in response to a low-side pulse SL. Specifically, the low-side driver 204 applies a high voltage $V_{REG}$ to the gate of the low-side transistor ML when the low-side pulse SL is high and applies a low voltage (0 V) to the gate of low-side transistor ML when the low-side pulse SL is low.

The bootstrap capacitor $C_B$ has one end coupled to the VS pin, and another end coupled to a $V_B$ pin. Wiring coupled to the VS pin is referred to as a switching line VS. Likewise, wiring coupled to the $V_B$ pin is referred to as a bootstrap line VB.

The level shifter 206 level-shifts the high-side pulse SH and supplies the high-side pulse SH to the high-side driver 202. The high-side driver 202 has an output coupled to the gate of the high-side transistor MH, has an upper power supply node N1 coupled to the bootstrap line VB, and has a lower power supply node N2 coupled to the switching line VS. The high-side driver 202 operates using a potential difference $V_{BS}=V_B-V_S$ between the bootstrap pin VB and the switching pin VS, that is, a voltage across the bootstrap capacitor $C_B$ as a power supply voltage. Therefore, $V_{BS}$ is referred to as a high-side power supply voltage.

The high-side driver 202 drives the high-side transistor MH in response to a high-side pulse SH' obtained as a result of the level shift. Specifically, the high-side driver 202 applies the high voltage $V_B$ to the gate of the high-side transistor MH when the high-side pulse SH' is high and applies the low voltage $V_S$ to the gate of high-side transistor MH when the high-side pulse SH' is low.

The switch SW1 that is a PMOS transistor and the diode D1 that is a rectifying element are provided in series between a constant voltage line (referred to as a REG line) through which the constant voltage $V_{REG}$ is supplied and the bootstrap line VB.

The comparison circuit 210 operates using a potential difference $V_{BS}$ (high-side power supply voltage) between the bootstrap line $V_B$ and the switching line VS as a power supply. The comparison circuit 210 compares the high-side power supply voltage $V_{BS}$ with a threshold voltage $V_{TH}$ corresponding to a target voltage $V_{BS(REF)}$ of the high-side power supply voltage $V_{BS}$ and generates an overvoltage detection signal OVDET indicating a magnitude relationship between the high-side power supply voltage $V_{BS}$ and the threshold voltage $V_{TH}$. The detection signal OVDET is set high when $V_{BS}>V_{TH}$ indicating an overvoltage state and is set low when $V_{BS}<V_{TH}$. The comparison circuit 210 may be made up of a voltage comparator.

A level shift circuit 230 level-shifts the detection signal OVDET down to a signal LVS_OUT of which the ground voltage is low.

The PMOS driver 212 drives the switch SW1 asynchronously with the switching of the high-side transistor MH and the low-side transistor ML in response to the output LVS_OUT of the level shift circuit 230. The switch SW1 is turned off when the overvoltage detection signal OVDET is high ($V_{BS} > V_{TH}$), and the switch SW1 is turned on when the overvoltage detection signal OVDET is low ($V_{BS} < V_{TH}$).

Figure 4A:
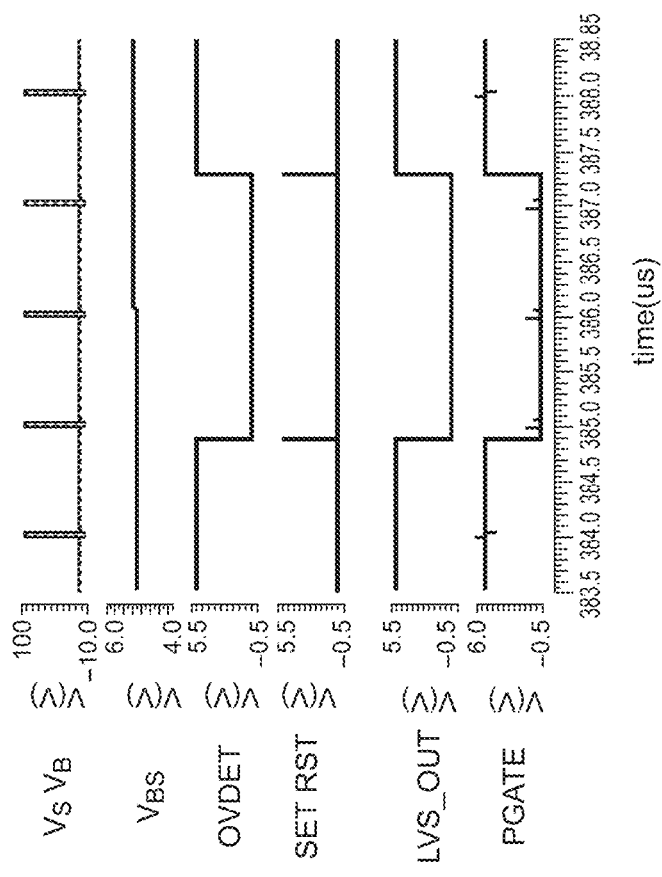
FIG. 4A and FIG. 4B are operation waveform diagrams (simulation result) of the switching circuit illustrated in FIG. 3.
Figure 4B:
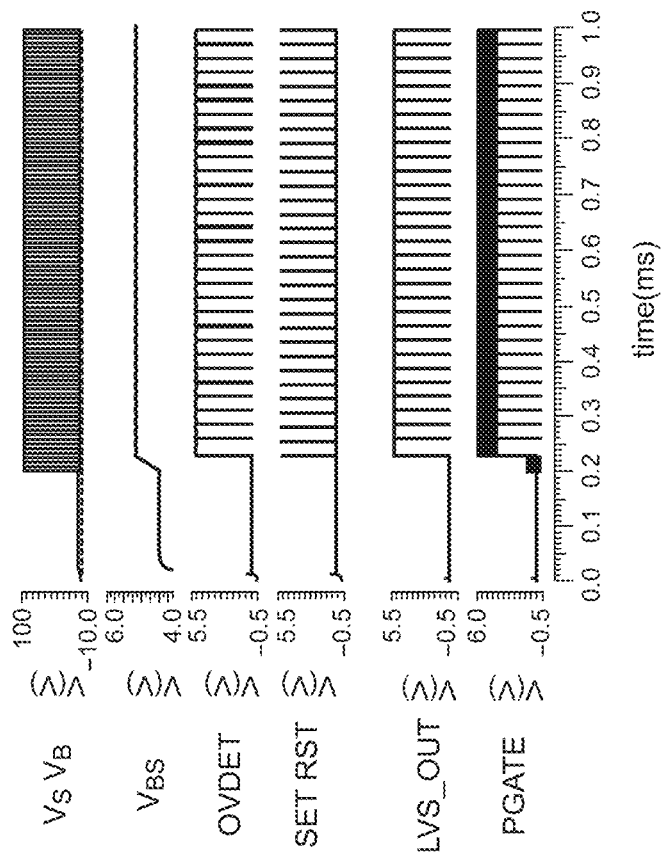

The configurations of the gate drive circuit 200 and the switching circuit 100 are as described above. Next, how the gate drive circuit 200 and the switching circuit 100 operate will be described. FIG. 4A and FIG. 4B are operation waveform diagrams (simulation result) of the switching circuit 100 illustrated in FIG. 3. FIG. 4B is a waveform obtained as a result of enlarging the time axis of FIG. 4A. Simulation was performed under the conditions of $V_{CC} = V_{REG} = 5$ V, oscillation frequency of 1 MHZ, ON time Ton=50 ns, $V_{IN}$=90 V, dead time of 30 ns, and $C_B$=1 μs.

Figure 5:
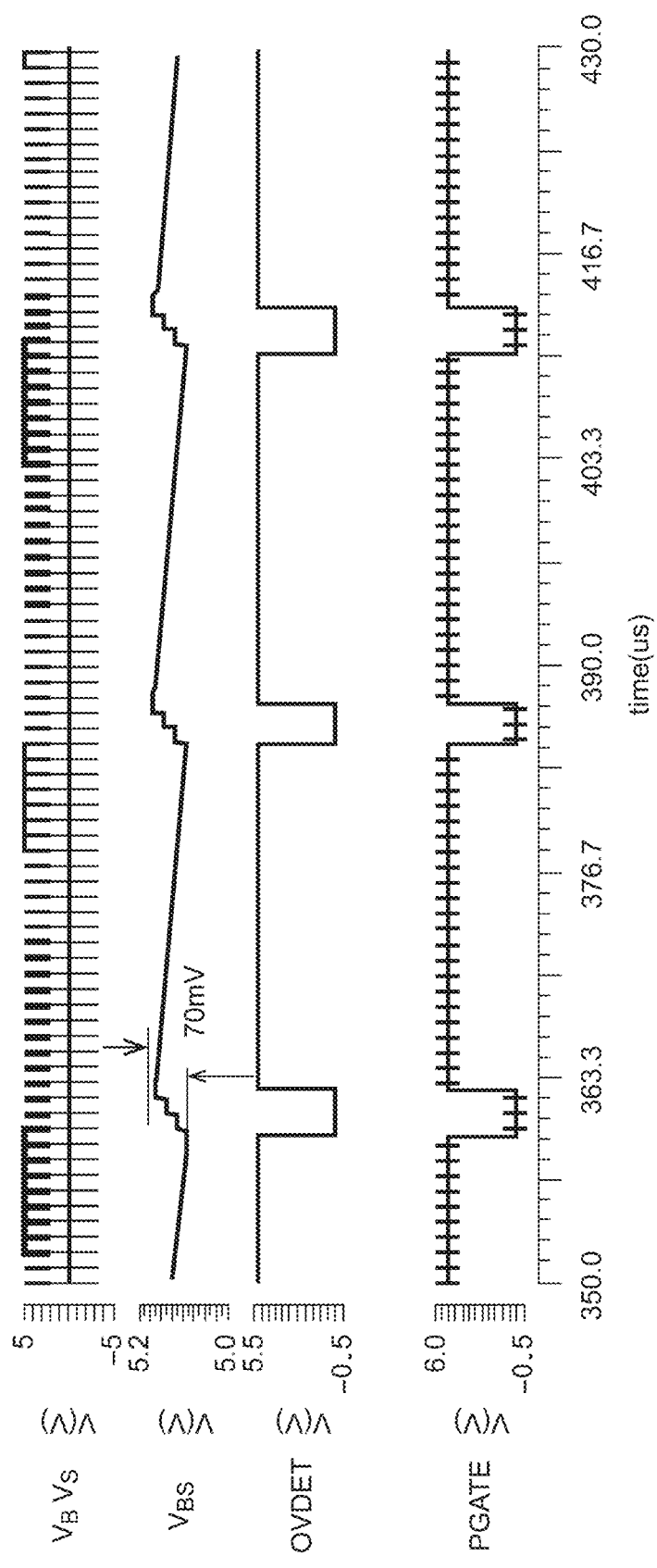
FIG. 5 is an operation waveform diagram (simulation result) of the switching circuit illustrated in FIG. 3.

FIG. 5 is a waveform diagram (simulation result) of the voltages $V_B$, $V_S$, the high-side power supply voltage $V_{BS}$, the overvoltage detection signal OVDET, and a gate voltage PGATE applied to the switch SW1. When the high-side power supply voltage $V_{BS}$ exceeds the threshold value $V_{TH}$, the overvoltage detection signal OVDET becomes high, the PGATE signal becomes high, and the switch SW1 is turned off accordingly. During this time, the high-side power supply voltage $V_{BS}$ decreases. Then, when the high-side power supply voltage $V_{BS}$ falls below the threshold value $V_{TH}$, the overvoltage detection signal OVDET becomes low, the PGATE signal becomes low, and the switch SW1 is turned on accordingly. During this period, a bootstrap circuit becomes active, and the high-side power supply voltage $V_{BS}$ rises each time the switching voltage $V_S$ switches. In this example, a ripple width of the high-side power supply voltage $V_{BS}$ is as low as 70 mV.

How the switching circuit 100 operates is as described above. The gate drive circuit 200 according to the embodiment can constantly monitor, regardless of whether the low-side transistor ML is on or off, the high-side power supply voltage $V_{BS}$ generated across the bootstrap capacitor $C_B$ with the comparison circuit 210. Therefore, there is no period during which the input of the comparison circuit 210 is in a high-impedance state, and it is thus possible to make noise immunity higher.

In the related art, there is a period during which the comparison circuit 210 is stopped, so that the ripple of the high-side power supply voltage $V_{BS}$ becomes large. On the other hand, the gate drive circuit 200 according to the embodiment can make the ripple of the high-side power supply voltage $V_{BS}$ small.

Figure 6:
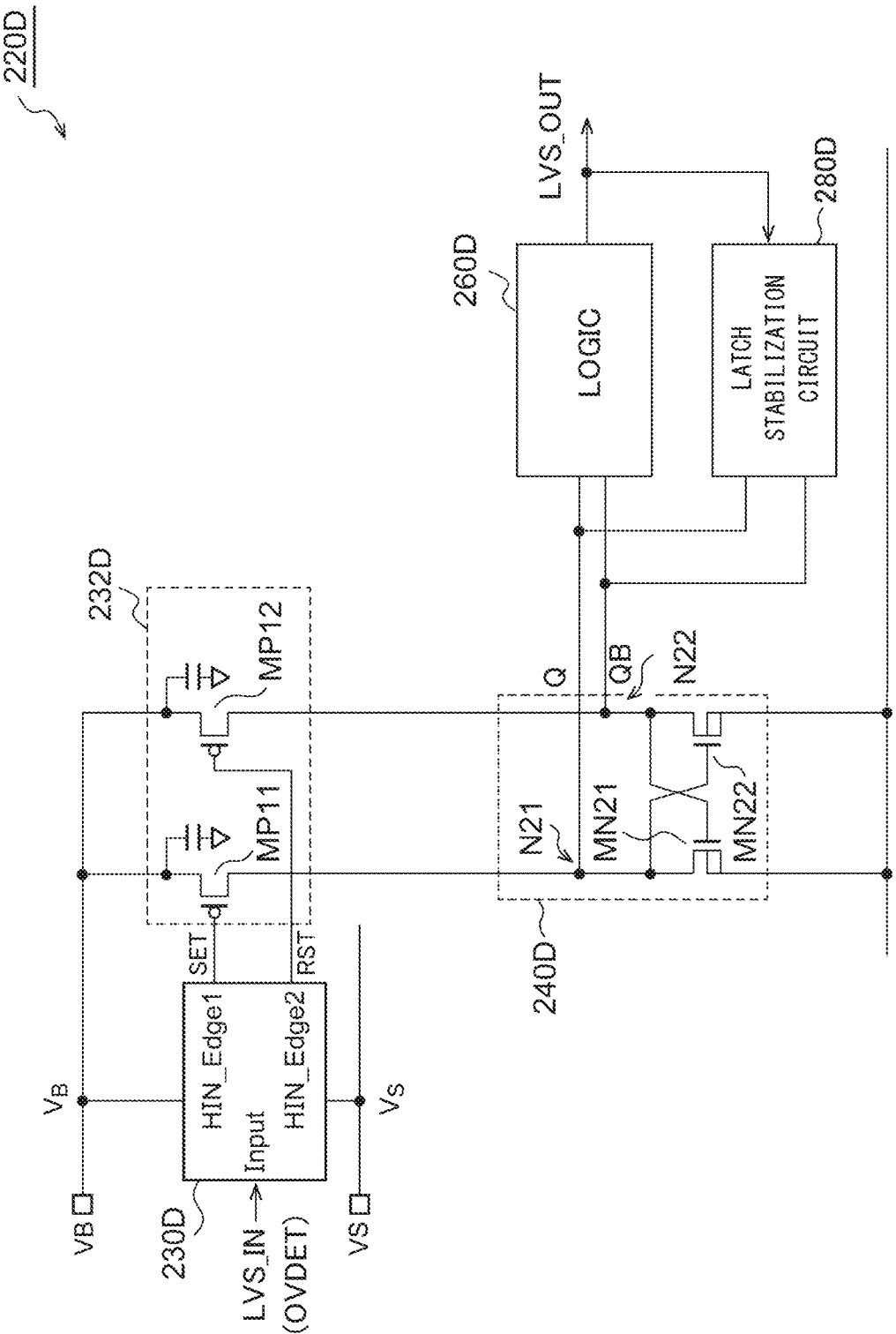
FIG. 6 is a circuit diagram illustrating a configuration example of a level shifter.

FIG. 6 is a circuit diagram illustrating a configuration example of the level shift circuit 220D. The level shift circuit 220D is a level shift-down circuit that converts an input signal LVS_IN (the above-described detection signal OVDET) of which $V_B$ is high and $V_S$ is low into the output signal LVS_OUT (LVS_OUT) of which the power supply voltage $V_{CC}$ (or $V_{REG}$) is high and the ground voltage 0V is low.

The level shift circuit 220D includes a pulse generator 230D, an open drain circuit 232D, a latch circuit 240D, a logic circuit 260D, and a latch stabilization circuit 280D.

The pulse generator 230D is a one-shot circuit, and generates, in response to a positive edge and a negative edge of the input signal LVS_IN, an active low set pulse SET and an active low reset pulse RST that are kept low for a period of a predetermined pulse width.

The open drain circuit 232D includes PMOS transistors MP11, MP12. A first transistor MP11 has a source coupled to the bootstrap line $V_B$ and is turned on in response to the set pulse SET. The second transistor MP12 has a source coupled to the bootstrap line VB and is turned on in response to the reset pulse RST.

The latch circuit 240D includes PMOS transistors MP21, MP22. A first transistor MP21 and a second transistor MP22 are cross-coupled and make a state transition in response to the output of the open drain circuit 232D.

The latch stabilization circuit 280D fixes, at a high level, one of complementary first node N21 and second node N22 of the latch circuit 240D in accordance with the output LVS_OUT of the level shift circuit 220D.

The logic circuit 260D receives an output (at least one of voltages at the first node N21 and the second node N22) of the latch circuit 240 and generates a level shift output signal LVS_OUT.

The latch stabilization circuit 280D is structured to maintain, at a low level, one of the complementary first node N21 and second node N22 of the latch circuit 240D in accordance with the level (high, low) of the output LVS_OUT of the level shift circuit 220.

For example, the latch stabilization circuit 280D operates to maintain the first node N21 at a high level when LVS_OUT is high, that is, the first node N21 is high, and operates to maintain the second node N22 at a high level when LVS_OUT is low, that is, the second node N22 is high.

Alternatively, the latch stabilization circuit 280 D may be structured to operate to maintain the second node N21 at a low level when LVS_OUT is high, that is, the first node N21 is high, and operates to maintain the first node N22 at a low level when LVS_OUT is low, that is, the second node N22 is high.

Figure 7:
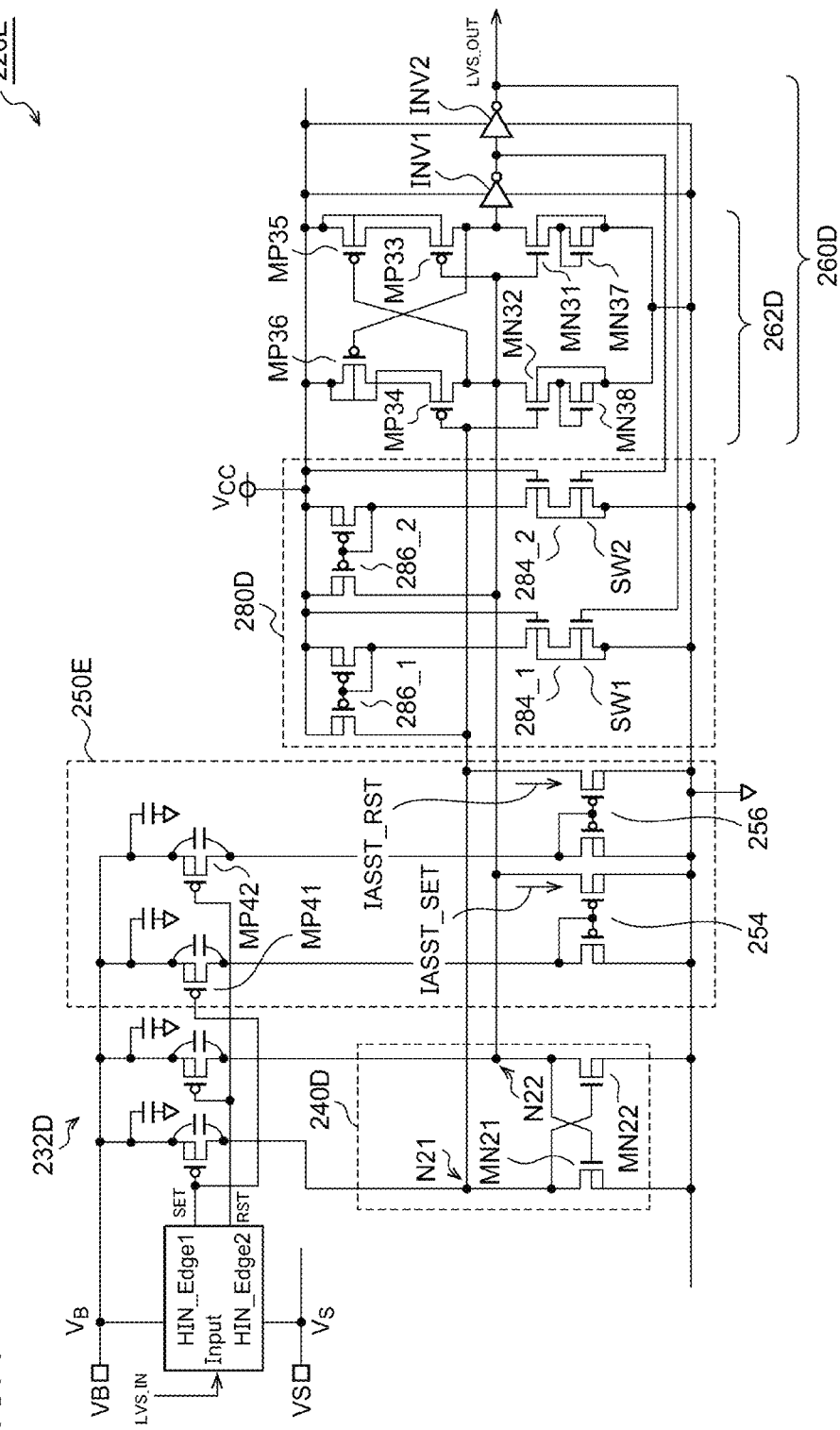
FIG. 7 is a circuit diagram illustrating a more specific configuration example of the level shifter.

FIG. 7 is a circuit diagram illustrating a more specific configuration example of the level shift circuit 220D. The logic circuit 260D includes a level shifter and latch circuit 262D, and inverters INV1, INV2.

The level shifter and latch circuit 262D receives and latches the output of the latch circuit 240D. The level shifter and latch circuit 262D shifts the output of the latch circuit 240 down to a signal of which the voltage $V_{CC}$ is high and the voltage 0V is low. The level shifter and latch circuit 262D includes transistors MN31, MN32, and MP33 to MP38. The output of the level shifter and latch circuit 262D is output through the two-stage inverters INV, INV2.

The latch stabilization circuit 280D includes a first switch SW1, a second switch SW2, a first impedance element 284_1, a second impedance element 284_2, a first current mirror circuit 286_1, and a second current mirror circuit 286_2. The first switch SW1 is turned on when the output LVS_OUT of the level shift circuit 220 is at a first level (high). The first impedance element 284_1 is coupled in series to the first switch SW1. The first current mirror circuit 286_1 copies an electric current flowing through the first impedance element 284_1 and sources a current IAUX_SET to the first node N21. As a result, the node N21 is pulled up.

The second switch SW2 is turned on when the output LVS_OUT of the level shift circuit 220 D is at a second level (low). The second impedance element 284_2 is coupled in series to the second switch SW2. The second current mirror circuit 286_2 copies an electric current flowing through the second impedance element 284_2 and sources a current IAUX_RST to the second node N22. As a result, the node N22 is pulled up.

Figure 8:
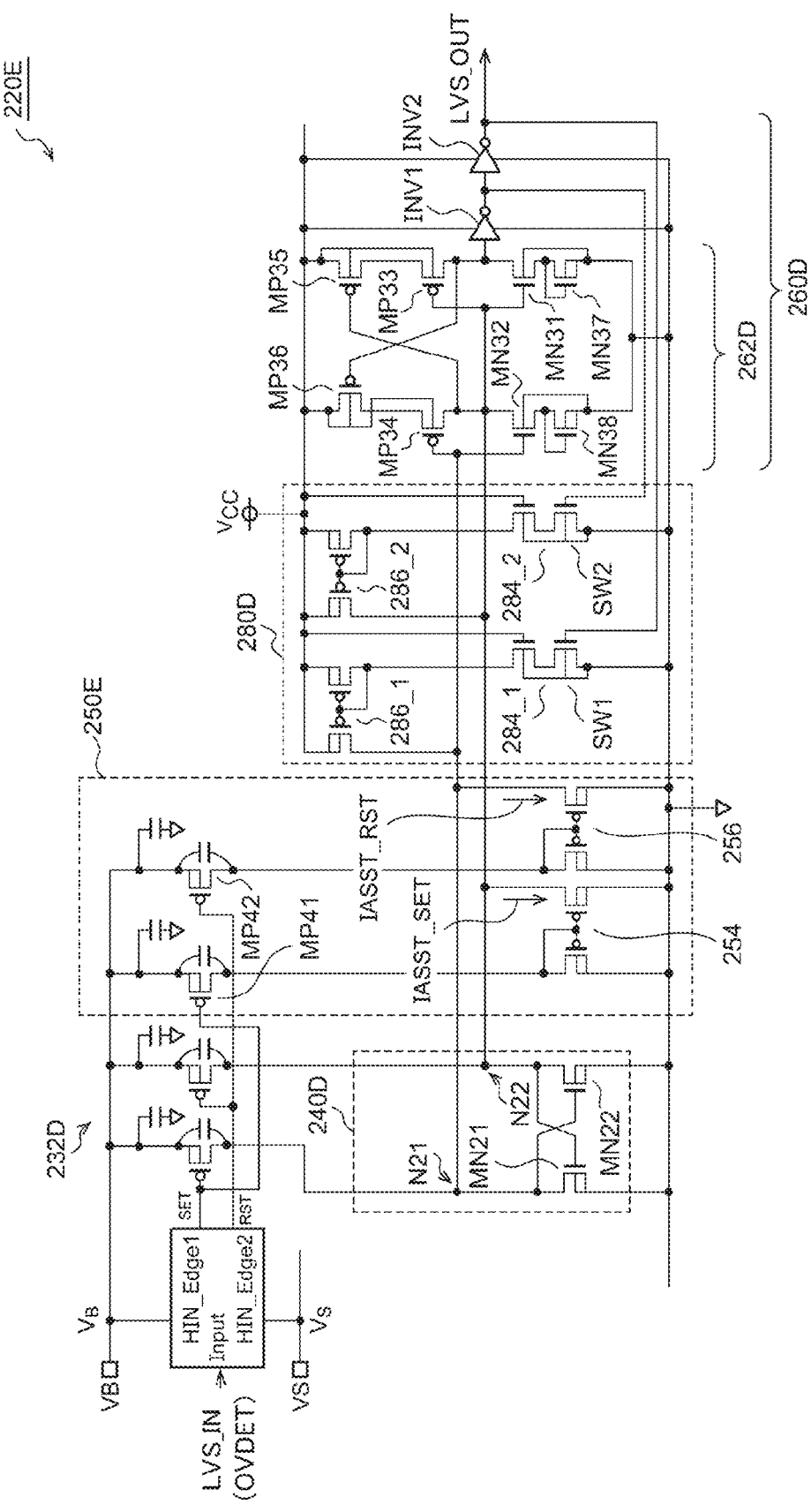
FIG. 8 is a circuit diagram illustrating another configuration example of the level shifter.

FIG. 8 is a circuit diagram illustrating another configuration example (220E) of the level shift circuit 220D. A level shift circuit 220E illustrated in FIG. 8 includes an assist circuit 250E in addition to the level shift circuit 220D illustrated in FIG. 7. The assist circuit 250E sinks an assist current IASST_SET from the second node N22 in response to the set pulse SET and sinks an assist current IASST_RST from the first node N21 in response to the reset pulse RST.

With the addition of the assist circuit 250E, it is possible to further increase the speed. In an embodiment, the assist circuit 250E may includes a second open drain circuit including a fifth transistor MP41 having a source coupled to the bootstrap line and structured to turn on in response to the set pulse, and a sixth transistor MP42 having a source coupled to the bootstrap line and structured to turn on in response to the reset pulse: a first current mirror 254 structured to fold a current through the fifth transistor so as to generate the first assist current; and a second current mirror 256 structured to fold a current through the sixth transistor so as to generate the second assist current.

Figure 9:
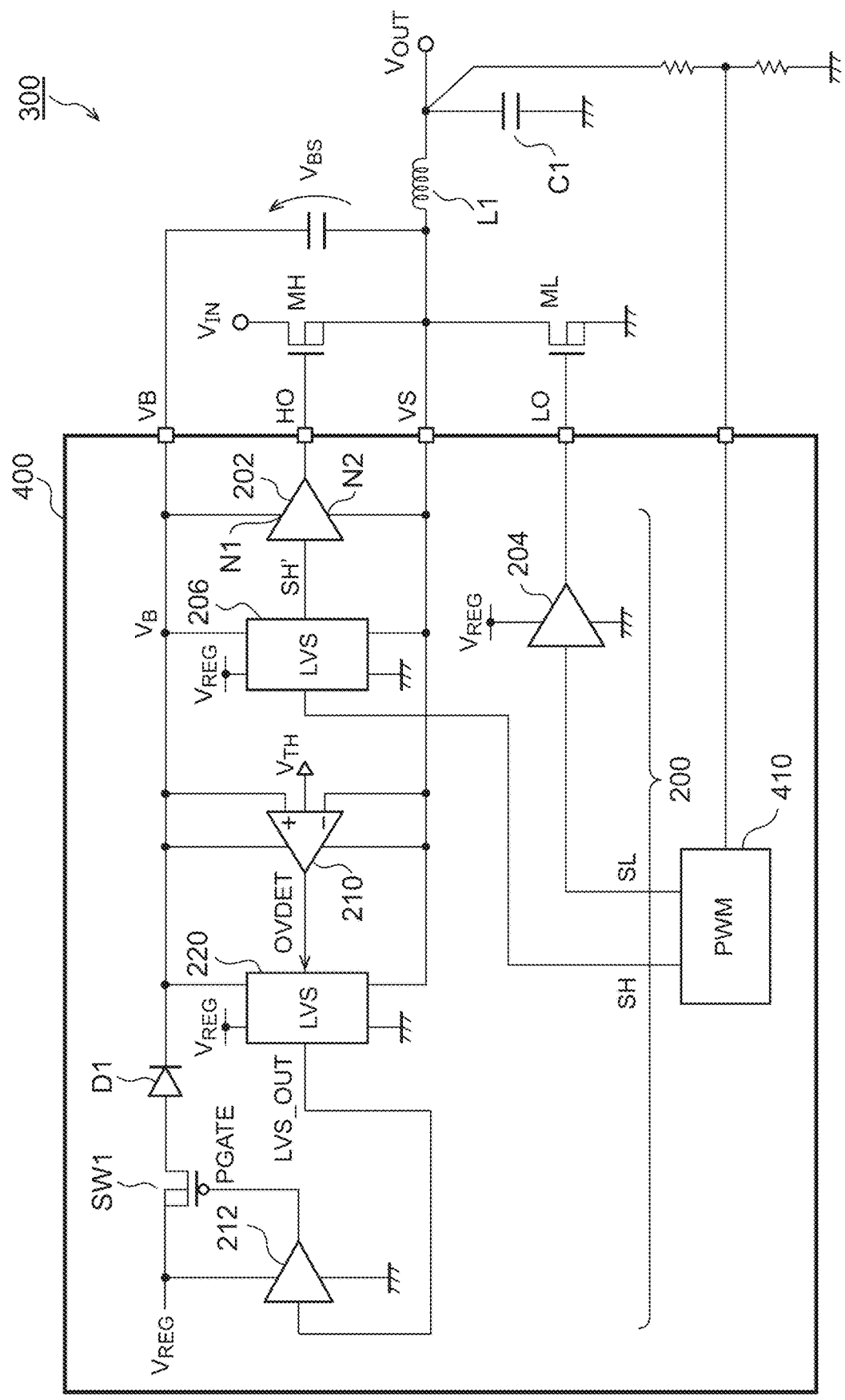
FIG. 9 is a block diagram of a control circuit of a switching power supply according to the embodiment.

Next, how the switching circuit 100 and the drive circuit 200 are used will be described. The gate drive circuit 200 is applicable to an isolated power supply or a non-isolated power supply. FIG. 9 is a block diagram of a switching power supply according to the embodiment. This switching power supply 300 is a step-down (buck) converter, and includes a high-side transistor MH, a low-side transistor ML, an inductor L1, an output capacitor C1, and a control circuit 400. The control circuit 400 includes a feedback circuit 410 in addition to the above-described gate drive circuit 200. The feedback circuit 410 receives a feedback signal $V_{FB}$ based on an output signal (output voltage $V_{OUT}$ or output current $I_{OUT}$) of the switching power supply 300, and generates pulse signals SH, SL of which the duty cycle or frequency is changed so as to make the feedback signal $V_{FB}$ as close as possible to a predetermined target value. The feedback circuit 410 may include a pulse width modulator, a pulse frequency modulator, or the like, and may be made up of an analog circuit (error amplifier) or a digital circuit (compensator).

FIG. 10A to FIG. 10F are circuit diagrams of a power supply including the gate drive circuit 200. The gate drive circuit 200 may be used to drive a pair of transistors A, B of a step-down converter illustrated in FIG. 10A.

Figure 10A:
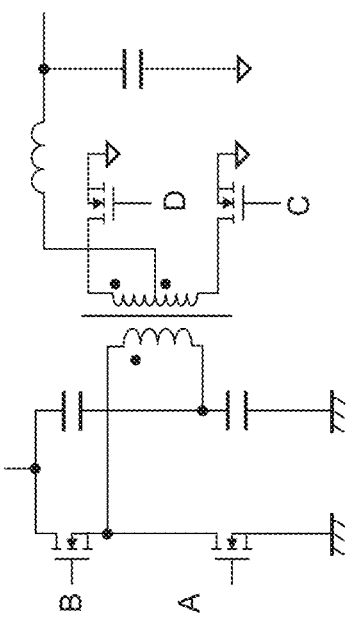
FIG. 10A to FIG. 10F are circuit diagrams of a power supply including the gate drive circuit.
Figure 10B:
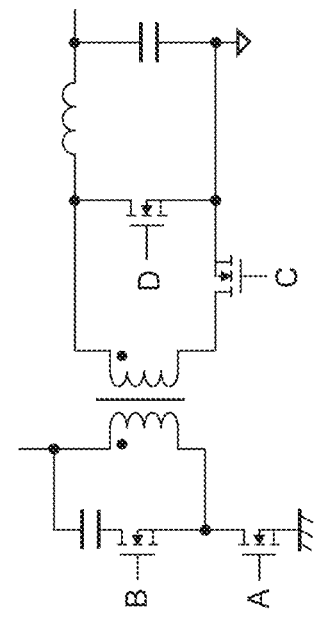

The gate drive circuit 200 is also applicable to a forward converter illustrated in FIG. 10B. Specifically, the gate drive circuit 200 may be used to drive a pair of a high-side transistor B and a low-side transistor A on the primary side.

Figure 10C:
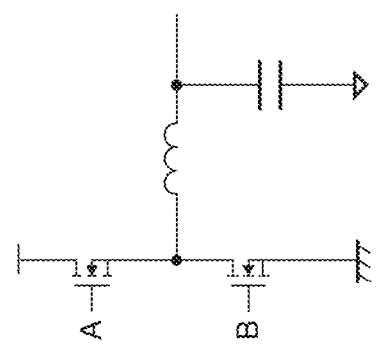

The gate drive circuit 200 is also applicable to a half-bridge converter illustrated in FIG. 10C. Specifically, the gate drive circuit 200 may be used to drive a pair of a high-side transistor B and a low-side transistor A on the primary side.

Figure 10D:
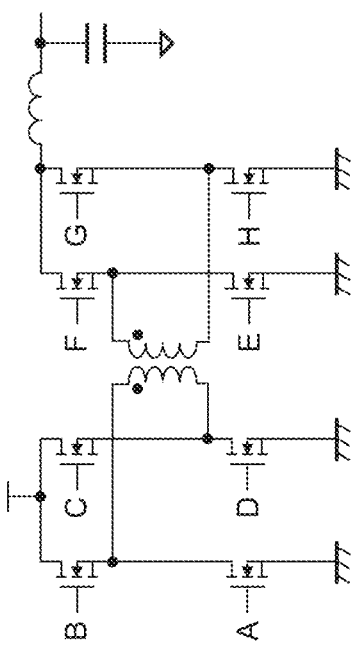

The gate drive circuit 200 is also applicable to a full-bridge converter illustrated in FIG. 10D. Specifically, the gate drive circuit 200 may be used for a pair of a high-side transistor B and a low-side transistor A on the primary side and a pair of a high-side transistor D and a low-side transistor C on the primary side.

Figure 10E:
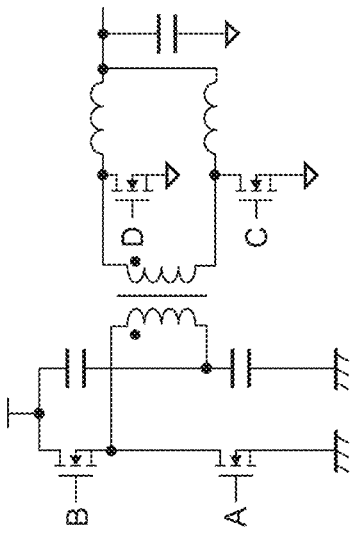

The gate drive circuit 200 is also applicable to a current doubler synchronous rectifier illustrated in FIG. 10E. Specifically, the gate drive circuit 200 may be used to drive a pair of a high-side transistor B and a low-side transistor A on the primary side.

Figure 10F:
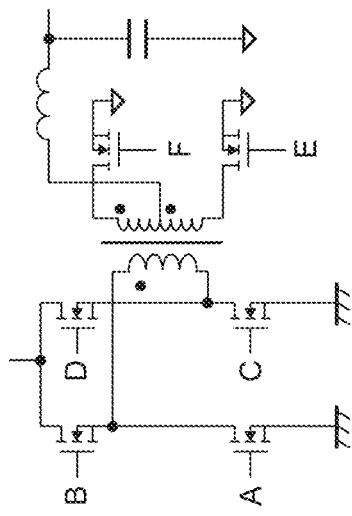

The gate drive circuit 200 is also applicable to a secondary-side full-bridge synchronous rectifier illustrated in FIG. 10F. Specifically, the gate drive circuit 200 may be used to drive a pair of a high-side transistor B and a low-side transistor A on the primary side or a pair of a high-side transistor C and a low-side transistor D on the primary side. Alternatively, the gate drive circuit 200 may be used to drive a pair of a high-side transistor F and a low-side transistor E on the secondary side or a pair of a high-side transistor G and a low-side transistor H on the secondary side.

It is to be understood by those skilled in the art that the embodiment is illustrative and that various modifications are possible for a combination of components or processes, and that such modifications are also within the scope of the present invention. Such modifications will be described below.

The switching circuit is used in various uses such as a motor drive circuit in addition to a power supply, and the present invention is also applicable to various uses other than the power supply.

The embodiment merely illustrates the principle and application of the present invention, and for the embodiment, many modifications or changes in arrangement are allowed without departing from the spirit of the present invention defined in the claims.

What is claimed is:

1. A gate drive circuit of a switching circuit including a high-side transistor and a low-side transistor, each of which is of an N-channel type, the gate drive circuit comprising:
   a switching terminal to be coupled to a source of the high-side transistor, a drain of the low-side transistor, and one end of a bootstrap capacitor;
   a bootstrap terminal to be coupled to another end of the bootstrap capacitor;
   a switching line coupled to the switching terminal;
   a bootstrap line coupled to the bootstrap terminal;
   a high-side driver having an output to be coupled to a gate of the high-side transistor, having an upper power supply node coupled to the bootstrap line, and having a lower power supply node coupled to the switching line;
   a low-side driver having an output to be coupled to a gate of the low-side transistor;
   a switch and a rectifying element of a P-channel metal oxide semiconductor (PMOS) transistor provided in series between a constant voltage line to which a constant voltage is supplied and the bootstrap line;
   a comparison circuit structured to operate using a high-side power supply voltage as a power supply, the high-side power supply voltage being a potential difference between the bootstrap line and the switching line, to generate a detection signal indicating a magnitude relationship between the high-side power supply voltage and a threshold voltage;
   a level shift circuit structured to level-shift the detection signal down to a signal of which a ground voltage is low; and
   a PMOS driver structured to drive the switch asynchronously with switching of the high-side transistor in response to an output of the level shift circuit,
   wherein the level shift circuit includes:
      a pulse generator structured to generate a set pulse and a reset pulse having a predetermined pulse width in response to a positive edge and a negative edge of the detection signal, respectively;
      a first open drain circuit including a first transistor having a source coupled to the bootstrap line and structured to turn on in response to the set pulse, and a second transistor having a source coupled to the bootstrap line and structured to turn on in response to the reset pulse;
      a latch circuit including a third transistor and a fourth transistor that are cross-coupled, the latch circuit being structured to make a state transition in response to an output of the first open drain circuit;
      a logic circuit structured to output a signal corresponding to a state of the latch circuit; and an assist circuit structured to sink a first assist current from a drain of the fourth transistor in response to the set pulse, and to sink a second assist current from a drain of the third transistor in response to the reset pulse, wherein the logic circuit includes:
- a level shift and latch circuit structured to latch and level shift down an output of the latch circuit; and
- two stage inverters structured to receive an output signal of the level shift and latch circuit, and wherein the assist circuit includes:
- a second open drain circuit including a fifth transistor having a source coupled to the bootstrap line and structured to turn on in response to the set pulse, and a sixth transistor having a source coupled to the bootstrap line and structured to turn on in response to the reset pulse; and
- a first current mirror structured to fold a current through the fifth transistor so as to generate the first assist current; and
- a second current mirror structured to fold a current through the sixth transistor so as to generate the second assist current.

2. The gate drive circuit according to claim 1, wherein the level shift circuit further includes a latch stabilization circuit provided between a power supply line and a ground line and structured to fix, at a low level, one of complementary first node and second node of the latch circuit in accordance with the output of the level shift circuit.

3. A control circuit of a switching power supply, comprising the gate drive circuit according to claim 1.

4. A switching power supply comprising the gate drive circuit according to claim 1.

* * * * *